United States Patent
Li et al.

(10) Patent No.: US 12,404,423 B2
(45) Date of Patent: Sep. 2, 2025

(54) CHEMICAL-MECHANICAL POLISHING LIQUID

(71) Applicant: ANJI MICROELECTRONICS (SHANGHAI) CO., LTD, Shanghai (CN)

(72) Inventors: Shoutian Li, Shanghai (CN); Xiaoming Ren, Shanghai (CN); Changzheng Jia, Shanghai (CN)

(73) Assignee: Anji Microelectronics (Shanghai) Co. Ltd, Shanghai (CN)

( * ) Notice: Subject to any disclaimer, the term of this patent is extended or adjusted under 35 U.S.C. 154(b) by 570 days.

(21) Appl. No.: 17/783,262

(22) PCT Filed: Dec. 3, 2020

(86) PCT No.: PCT/CN2020/133600
§ 371 (c)(1),
(2) Date: Dec. 12, 2022

(87) PCT Pub. No.: WO2021/121043
PCT Pub. Date: Jun. 24, 2021

(65) Prior Publication Data
US 2023/0104112 A1    Apr. 6, 2023

(30) Foreign Application Priority Data
Dec. 19, 2019 (CN) .......................... 201911320533.7

(51) Int. Cl.
*C09G 1/02* (2006.01)
*H01L 21/3105* (2006.01)

(52) U.S. Cl.
CPC .......... *C09G 1/02* (2013.01); *H01L 21/31053* (2013.01)

(58) Field of Classification Search
None
See application file for complete search history.

(56) References Cited

U.S. PATENT DOCUMENTS

| 10,155,886 B2 | 12/2018 | Oota et al. |
| 2008/0202037 A1 | 8/2008 | Oswald et al. |
| 2017/0204293 A1* | 7/2017 | Megherhi ................ C09G 1/02 |
| 2018/0244956 A1* | 8/2018 | Hains ................ H01L 21/31053 |

FOREIGN PATENT DOCUMENTS

| CN | 105895518 A | 8/2016 |
| CN | 109251671 A | 1/2019 |
| CN | 109251675 A * | 1/2019 ............. C09G 1/02 |

* cited by examiner

*Primary Examiner* — Shamim Ahmed
(74) *Attorney, Agent, or Firm* — Dentons US LLP

(57) ABSTRACT

Disclosed is a chemical mechanical polishing solution, which contains water, cerium oxide, polyquatemium, carboxylic acid containing a benzene ring and polyvinylamine. The function of auto stop in its true sense can only be achieved by using polyquatemium, carboxylic acid containing a benzene ring and polyvinylamine together. On the blanks, the polishing rates are low, while at the high step heights of patterned silicon chips, high polishing rates are kept. The lower is the step height, the better is the polishing rate inhibited, and thus the function of auto stop is achieved.

12 Claims, 1 Drawing Sheet

CHEMICAL-MECHANICAL POLISHING LIQUID

CROSS-REFERENCE TO PRIOR APPLICATIONS

This application is a National Stage of PCT/CN2020/133600, filed Dec. 3, 2020, and published Jun. 24, 2021 as WO 2021/121043 A1, which claims priority to Chinese Patent Application No. 201911320533.7, filed Dec. 19, 2019, each hereby expressly incorporated by reference in its entirety.

TECHNICAL FIELD

The present invention relates to a chemical mechanical polishing solution.

BACKGROUND

Currently, chemical mechanical polishing (CMP) has become the most effective and mature planarization technology in the process of manufacturing micro-nano devices. In the process of manufacturing micro-nano devices, the technology of Interlayer Dielectric-ILD (Interlayer Dielectric-ILD) has become the mainstream isolation technology because of its outstanding performance of isolation, plat surface topography and good locking performance. The role of CMP in the formation of ILD structure is to planarize a stepped oxide layer, and its main polishing performance parameters include polishing rate and planarization efficiency. To improve the polishing rate of dielectric materials, it is generally more effective to use cerium oxide as polishing particles, but a high polishing rate often leads to over-polishing, i.e., a high Trench Loss on patterned silicon wafer, resulting in a low planarization efficiency. In the polishing solution with the function of auto stop which is generally adopted in the process of CMP, the so-called function of auto stop or self-stopping is the relationship between the polishing rate and the step height. When the step height is high, for example, 2,000 Å, the polishing rate is high, for example, 2,000 Å/min. When the step height is low, for example, near 0 Å, the polishing rate is low, for example, reduced from 2,000 Å/min to less than 400 Å/min. In other words, the polishing rates are high on the pits of blanks or patterned wafers, and low on the high step heights of patterned wafers. It can keep high polishing rates on high step heights, the lower is the step height, the better is the polishing rate inhibited, and thus the function of auto stop is achieved. In the polishing solution without the function of auto stop, the polishing rate has little relation with the step height. Generally, the polishing rate change will not be more than 1.5 times the speed of blanks. The FIGURE is the structure diagram of the patterned wafer 1 in the prior art, where the patterned wafer has bump 1 and pit 2, bump line width H1 and pit width H2. When the chemical mechanical polishing solution is polishing the patterned wafer, a perfect state will be that the polishing rate is high when the pits are being polished and the polishing rate is low when the bumps are being polished. In other words, the higher is the bump polishing rate/pit polishing rate ratio, or the pattern polishing rate/TEOS blank ratio, the better. When a high polishing rate is kept in a high step height, the lower is the step height, the better is the polishing rate inhibited in a low step height, and thus the function of auto stop is achieved. It is noteworthy that if the polishing rates of blanks and patterned silicon wafers are both either high or low, the function of auto stop function is absent. Once the polishing solution has the function of auto stop, without the need to design a great thickness for the dielectric layer in the process of chip designing, nor invest in polishing end point detection devices, we can reduce the silicon chip trench loss, improving the overall efficiency of the process of planarization.

The traditional polishing solution with the function of auto stop is cerium oxide and negatively charged electrolyte such as polyacrylic acid component. For example, in American Application 2008/0121839, Korean Patent 10-1524624, and International Patent Application WO2006/115393, the function of auto stop is achieved by using negatively charged polymers, and the step height has limited lowering capacity due to the charge repulsion between the negatively charged polymer particles and the polished silicon dioxide wafers. Therefore, there is a need to find a more effective chemical mechanical polishing solution with the function of auto stop to improve the polishing rate and planarization rate.

DESCRIPTION

The invention aims at balancing the polishing rate and planarization efficiency of dielectric materials when the chemical mechanical polishing solution planarizes a stepped oxide layer, which cannot be achieved in the prior art.

The invention provides a chemical mechanical polishing solution including cerium oxide, polyquaternium, carboxylic acid containing a benzene ring, polyvinylamine and water. Preferably, the cerium oxide is sol-type cerium oxide.

Further, the polyquaternium is one or more from polyquaternium-1, polyquaternium-2, polyquaternium-4, polyquaternium-6, polyquaternium-10, polyquaternium-11, polyquaternium-16, polyquaternium-37, polyquaternium-39, and polyquaternium-51, preferably polyquaternium-6.

Further, the carboxylic acid containing a benzene ring is the arbitrary combination of one or more than one from salicylic hydroxamic acid, salicylic acid and 4-hydroxybenzoic acid, preferably 4-hydroxybenzoic acid.

Further, the concentration of the cerium oxide is 0.5 wt %-2 wt %, preferably 0.8-1.5 wt %. Further, the concentration of the polyquaternium is 1 ppm-100 ppm, preferable 13.5 ppm-15 ppm.

Further, the concentration range of the carboxylic acid containing a benzene ring is 900 ppm-2,500 ppm, preferably 1,000-2,000 ppm.

Further, the concentration range of the polyvinylamine is 0.5-6 ppm, preferably 1-4 ppm.

Further, the molecular weight of the polyvinylamine is 400-750,000, preferably 600-25,000.

In the present invention, ppm refers to the mass concentration expressed with the parts per million of solute mass to total solution mass, which is called ppm concentration. The wt % and the percentage of each component are mass percentage concentrations.

The reagents and raw materials used in the present invention are commercially available.

The principle of the present invention is that polyquaternium, carboxylic acid containing a benzene ring, and polyvinylamine are capable of forming an inhibiting film on the surfaces of particles and silicon dioxide. If the inhibiting films is properly proportioned, it can be moved aside by mechanical force under the structure of particles with steps, and in the absence of steps, it cannot be moved aside by the insufficient mechanical force, thus reducing the polishing rate of the chemical mechanical polishing solution on pits or blanks.

The present invention has the following positive and progressive effects:
(1) To provide a chemical mechanical polishing solution with the function of auto stop in its true sense, which can keep a high polishing rate when the oxide layer of patterned wafer has a high step height. The lower is the step height, the better is the polishing rate inhibited. When the patterned wafer is planarized, the polishing rate of the oxide layer becomes low;
(2) To provide a chemical mechanical polishing solution with low solid content, in which the content of cerium oxide is 0.5 wt %-2 wt %, while that in the prior art is 2 wt %-6 wt %;
(3) The polishing methods adopting the applied chemical mechanical polishing solution have a wide window for over-polishing. When the patterned wafer has been polished for a certain time, and the pit height is approximate to the bump height, both the pit and the bump have a low polishing rate. In other words, when the patterned wafer is polished flat, the wafer removal amount by polishing will not increase excessively even by extending the polishing time (over-polishing).
(4) The polishing methods adopting the chemical mechanical polishing solution in the application have the advantages of simplified steps and efficient planarization.

DESCRIPTION OF THE DRAWING

The FIGURE is the structure diagram of longitudinal section of patterned wafers

Drawing reference marks:

Figure 1:
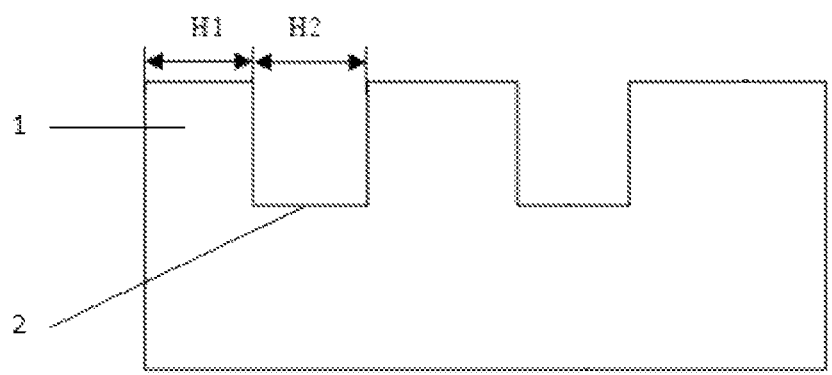

1-bump, 2-pit, H1-bump line width, H2-pit width.

EMBODIMENTS

The advantages of the invention will be further explained in detail with reference to the following embodiments, but the present invention is not limited to the described embodiments.

Experiment design principle to verify whether the polishing solution has the function of auto stop: in verifying whether the polishing solution has the function of auto stop, since the blanks are low in cost, first of all, simulation verification is performed on the blanks to detect low polishing rates, namely, function of stop. Then, further verification is performed on the patterned wafers to detect high polishing rates on high step heights, thus the bump/blank ratio is obtained. Generally, the bump/blank ratio range for chemical mechanical polishing solutions with the function of auto stop is at least greater than 2, and a high bump/blank ratio is the essential condition for the function of auto stop. Finally, verification is performed on low step heights to detect low bump polishing rates and pit polishing rates. It is the necessary and sufficient condition for chemical mechanical polishing solutions to have the function of auto stop that when the patterned wafer is at high step heights, the chemical mechanical polishing solution has high bump polishing rates and low pit polishing rates, and that when the patterned wafer is at low step heights, the chemical mechanical polishing solution has low bump polishing rates and pit polishing rates.

Comparative Embodiment 1

Preparation method of polishing solution: In this comparative embodiment, the comparative embodiment 1A is 1.0 wt % sol-type cerium oxide, the comparative embodiment 1B is 10 ppm polyvinylamine (molecular weight Mw=600) added to the comparative embodiment 1A, and the embodiment 1C is 1,500 ppm 4-hydroxybenzoic acid (4-HBA) added to the comparative embodiment 1B, with mass percentage being complemented to 100% with water. In the above comparative embodiments and embodiment, the pH value is adjusted 4.5 by adding ammonia water (NH4OH) or nitric acid (HNO3). Refer to Table 1 for details of components.

Polishing method: The polishing machine Mirra is used to polish TEOS blanks and patterned wafers. The corresponding polishing conditions include: IC1010 polishing pad, polishing disk (Platten) and polishing head (Carrier) with rotating speed being set at 93 rpm and 87 rpm respectively, polishing pressure set at 3 psi or 5 psi, and flow rate of polishing solution set at 150 mL/min. The FIGURE shows that the patterned wafer has bump 1 and pit 2, and the measurement is achieved at the bump line width H1/pit width H2 of 500 um/500 um. Refer to Table 2 for polishing results. Among these results, the polishing pressures of comparative implement 1A and comparative implement 1B are 3 psi, and that of the comparative embodiment 1C is 3 psi and 4 psi, respectively. The thickness of the TEOS film is measured by using NanoSpec nonmetal film thickness measuring instrument (NanoSpec6100-300). The thickness of the blanks is obtained by measuring 49 points on the diameter line at equal intervals, starting from 3 mm away from the edge of the wafer. The polishing rate is the average value of these 49 points. The step heights of patterned wafers are measured by using Bruker Nano's DETKAK XTL.

TABLE 1

Components of Comparative Embodiments

| Polishing solution | cerium oxide (wt %) | Additive 1 | Concentration of additive 1 (ppm) | Additive 2 | Concentration of additive 2 (ppm) | pH |
|---|---|---|---|---|---|---|
| Comparative embodiment 1A | 1 wt % | None | None | None | None | 4.5 |
| Comparative embodiment 1B | 1 wt % | Polyvinylamine (Mw = 600) | 10 | None | None | 4.5 |
| Comparative embodiment 1C | 1 wt % | Polyvinylamine (Mw = 600) | 10 | 4-hydroxybenzoic acid | 1500 | 4.5 |
| Comparative embodiment 1D | 1 wt % | None | None | 4-hydroxybenzoic acid | 1500 | 4.5 |

TABLE 2

CMP Conditions and Results

| Polishing solution | Polishing pressure (psi) | TEOS blank rate (Å/min) | Bump polishing rate (Å/min) | Bump/blank ratio |
|---|---|---|---|---|
| Comparative embodiment 1A | 3 | 5156 | Not measured | None |
| Comparative embodiment 1B | 3 | 882 | 1184 | 1.3 |
| Comparative embodiment 1C | 3 | 110 | 1192 | 10.8 |
| Comparative embodiment 1C | 5 | 125 | 1230 | 9.8 |
| Comparative embodiment 1D | 3 | 5642 | Not measured | None |

The polishing solutions from top to bottom in Table 1 correspond to the polishing conditions and results in Table 2. As seen from Table 1 and Table 2, by adding 4-hydroxybenzoic acid to comparative embodiment 1A, comparative embodiment 1D is obtained and the TEOS polishing rates of blanks are not inhibited. Therefore, the chemical mechanical polishing solution of comparative embodiment 1D does not have the function of auto stop. By adding polyvinylamine (molecular weight is 600) to comparative embodiment 1A, comparative embodiment 1B is obtained, the TEOS blank polishing rates can be effectively inhibited by being reduced from 5,156 Å/min to 882 Å/min, but the patterned wafer polishing rates are as low as only 1,184 Å/min and the bump/blank ratio is just 1,3. These are not the characteristics of auto stop because the range of bump/blank ratios of chemical mechanical polishing solutions characterized with auto stop is at least greater than 2. By adding 4-hydroxybenzoic acid to comparative embodiment 1B, comparative embodiment 1C is obtained, where the polishing solution performs polishing under different polishing pressure conditions (3 psi and 5 psi, respectively). As seen from Table 2, the TEOS blank rates are further reduced by approximately eight times to 110 Å/min and 125 Å/min, respectively, the bump/blank polishing ratio on patterned wafer increases to approximately 10, but the bump polishing rates remain low, which are 1,192 Å/min and 1,230 Å/min, respectively in Table 2. These are not in accordance with the definition of the function of auto stop, either. The auto stop is highly related to the step height. When the step height is as high as 10,000 Å, for example, and the polishing pad deforms and cannot have contact with the pit bottom, all polishing solutions can only start polishing from the step top; when the step height is reduced to 1,000 Å, for example, the polishing pad will suffer deformation, which becomes graver as the pressure increases. When the polishing pad has contact with the pit bottom, the bottom polishing rate will increase from 0. The lower is the step, the faster increases the bottom rate. The bottom rate increases till it is the same as that of the step top. Briefly speaking, the function of auto stop is related to the polishing rate and the step height. When the step height is high, usually >2,000 Å, the polishing rate is high, usually >2,000 Å/min. When the step is low, usually near 0 Å (the blank height of the blank, namely the step height that of the step is 0 Å), the polishing rate is low, reduced from 2,000 Å/min to less than 400 Å/min, for example. The auto stop is that when the step is as low as less than 1,000 Å, for example, the bottom polishing rate remains as low as less than 300 Å/min, for example, like that of the blank. The auto stop is not the literally strict complete stop, but still has some polishing rates, for example, 300 Å/min. Certainly, these rates are subject to no strict numerical limits. Therefore, the polishing solution formulas in the comparative embodiment 1C are not the chemical mechanical polishing solutions with the function of auto stop in its true sense. Likewise, the chemical mechanical polishing solutions containing cerium oxide and polyquaternium have low bump polishing rates of patterned wafers, and are therefore not the chemical mechanical polishing solutions with the function of auto stop in its true sense, either.

In conclusion, the chemical mechanical polishing solutions obtained from cerium oxide with polyvinylamine, or cerium oxide with 4-hydroxybenzoic acid, or cerium oxide with polyvinylamine and 4-hydroxybenzoic acid do not have the function of auto stop.

Comparative Embodiment 2

Preparation method: In this comparative embodiment, the comparative embodiment 2A is 1.2 wt % sol-type cerium oxide, and embodiment 2B is polyquaternium-6 and 4-hydroxybenzoic acid added to the comparative embodiment 2A (refer to Table 3). In the comparative embodiment 2A and the embodiment 2B, the pH value is adjusted 4.5 by adding ammonia water ($NH_4OH$) or nitric acid ($HNO_3$).

Polishing method: The polishing machine Mirra is used to polish TEOS blanks and patterned wafers. The corresponding polishing conditions include: IC1010 polishing pad, polishing disk (Platten) and polishing head (Carrier) with rotating speed being set at 93 rpm and 87 rpm respectively, and flow rate of polishing solution set at 150 mL/min. The thickness of the TEOS film is measured by using NanoSpec nonmetal film thickness measuring instrument (NanoSpec6100-300). The thickness of the blanks is obtained by measuring 49 points on the diameter line at equal intervals, starting from 3 mm away from the edge of the wafer. The polishing rate is the average value of these 49 points. The step heights of patterned wafers are measured by using Bruker Nano's DETKAK XTL, and the measurement is achieved at the bump line width/pit width of 500 um/500 um. Table 4 are the polishing results obtained by different formulas under different polishing pressure conditions.

TABLE 3

Components of Comparative Embodiments and Embodiments

| Polishing solution | Cerium oxide (wt %) | Additive #1 | Concentration of additive #1 (ppm) | Additive #2 | Concentration of additive #2 (ppm) | pH |
|---|---|---|---|---|---|---|
| Comparative embodiment 2A | 1.2 wt % | None | None | None | None | 4.5 |
| Comparative embodiment 2B | 1.2 wt % | polyquaternium-6 | 13.5 | 4-hydroxybenzoic acid | 1500 | 4.5 |
| Comparative embodiment 2C | 1.2 wt % | polyquaternium-6 | 13.5 | None | None | 4.5 |

TABLE 4

CMP Results

| Polishing solution | Polishing pressure (psi) | TEOS rate (Å/min) | Bump polishing rate (Å/min) | Bump/blank ratio |
|---|---|---|---|---|
| Comparative embodiment 2A | 3 | 4170 | Not measured | None |
| Comparative embodiment 2A | 5 | 8575 | Not measured | None |
| Comparative embodiment 2B | 3 | 116 | 978 | 8.4 |
| Comparative embodiment 2B | 5 | 275 | 10420 | 37.9 |
| Comparative embodiment 2C | 3 | 1154 | Not measured | None |
| Comparative embodiment 2C | 5 | 1644 | Not measured | None |

By adding polyquaternium-6 and 4-hydroxybenzoic acid as additives to the comparative embodiment 2A, the comparative embodiment 2B is obtained. As seen from the comparative embodiment 2A and the comparative embodiment 2B, the chemical mechanical polishing solutions containing polyquaternium-6 and 4-hydroxybenzoic acid are capable of reducing significantly the TEOS blank polishing rate when the polishing pressure is either 3 psi or 5 psi. But when the polishing pressure is 3 psi, the bump polishing rate remains as low as only 978 Å/min, less than 2,000 Å/min, which is not in accordance with the definition of the function of auto stop. However, under the polishing condition of 5 psi, the bump polishing rate of patterned wafer increases significantly to 10,420 Å/min and the bump/blank ratio reaches 37.9. As seen from comparative embodiment 2C, in the cases of 3 psi and 5 psi, cerium oxide with polyquaternium-6 has high blank polishing rates (1,154 Å/min and 1,644 Å/min, respectively), which are not lower than 300 Å/min. Therefore, the chemical mechanical polishing solutions containing cerium oxide and polyquaternium-6 do not have the function of auto stop.

In conclusion, as seen from the comparative embodiment 2B, the chemical mechanical polishing solutions obtained from cerium oxide with polyquaternium-6 and 4-hydroxybenzoic acid potentially have the function of auto stop, which should be subject to further verification when the patterned wafers are planarized. As seen from the comparative embodiment 2C, the chemical mechanical polishing solutions containing cerium oxide and polyquaternium-6 do not have the function of auto stop.

Embodiment 3

Preparation method: In this embodiment, reference embodiment 1A is 1.2 wt % sol-type cerium oxide, and in other embodiments and comparative embodiments, a certain amount of compounds are added to the reference embodiment (refer to Table 5), and the pH value is adjusted 4.5 by adding ammonia water (NH4OH) or nitric acid (HNO3).

Polishing method: The polishing machine Mirra is used to polish patterned wafers. The corresponding polishing conditions include: IC1010 polishing pad, polishing disk (Platten) and polishing head (Carrier) with rotating speed being set at 93 rpm and 87 rpm respectively, flow rate of polishing solution set at 150 mL/min, and polishing pressure set at 5 psi. The thickness of the TEOS film is measured by using NanoSpec nonmetal film thickness measuring system (NanoSpec6100-300, Shanghai Nanospec Technology Corporation). The thickness of the blanks is obtained by measuring 49 points on the diameter line at equal intervals, starting from 3 mm away from the edge of the wafer. The polishing rate is the average value of these 49 points. The step heights of patterned wafers are measured by using HRP (Bruker Nano's DETKAK XTL), and the measurement is achieved at the bump line width/pit width of 30 um/70 um, 50 um/50 um and 100 um/100 um, respectively.

TABLE 5

Components of Comparative Embodiments and Embodiment

| Polishing solution | cerium oxide (wt %) | Additive #1 | Concentration of additive #1 (ppm) | Additive #2 | Concentration of additive #2 (ppm) | Additive #3 | Concentration of additive #3 (ppm) | pH |
|---|---|---|---|---|---|---|---|---|
| Comparative embodiment 3A | 1.2 t % | polyquaternium-6 | 15 | 4-hydroxybenzoic acid | 1500 | None | None | 4.5 |
| Comparative embodiment 3B | 1.2 t % | polyquaternium-6 | 15 | None | None | Polyvinylamine | 2 | 4.5 |
| Embodiment 3C | 1.2 t % | polyquaternium-6 | 15 | 4-hydroxybenzoic acid | 1500 | Polyvinylamine | 2 | 4.5 |

TABLE 6

CMP Results

| | Bump line width/pit width | | | | | | | | |
|---|---|---|---|---|---|---|---|---|---|
| | 30 um/70 um | | | 50 um/50 um | | | 100 um/100 um | | |
| Polishing solution | Step height (Å) | Bump polishing rate (Å/min) | Pit polishing rate (Å/min) | Step height (Å) | Bump polishing rate (Å/min) | Pit polishing rate (Å/min) | Step height (Å) | Bump polishing rate (Å/min) | Pit polishing rate (Å/min) |
| Comparative embodiment 3A | 15071 | 4206 | 0 | 14711 | 4906 | 0 | 16539 | 4898 | 0 |
| Comparative embodiment 3A | 29 | 6800 | 6708 | 9 | 5700 | 6772 | 22 | 6524 | 6580 |

TABLE 6-continued

CMP Results

| | Bump line width/pit width | | | | | | | | |
|---|---|---|---|---|---|---|---|---|---|
| | 30 um/70 um | | | 50 um/50 um | | | 100 um/100 um | | |
| Polishing solution | Step height (Å) | Bump polishing rate (Å/min) | Pit polishing rate (Å/min) | Step height (Å) | Bump polishing rate (Å/min) | Pit polishing rate (Å/min) | Step height (Å) | Bump polishing rate (Å/min) | Pit polishing rate (Å/min) |
| Comparative embodiment 3B | 3959 | 1964 | 68 | 5296 | 1656 | 56 | 5754 | 1344 | 96 |
| Comparative embodiment 3B | 37 | 0 | 1840 | 31 | 0 | 524 | 249 | 244 | 360 |
| Embodiment 3C | 19793 | 5388 | 0 | 22393 | 4940 | 0 | 23233 | 4344 | 0 |
| Embodiment 3C | 109 | 52 | 66 | 170 | 96 | 70 | 376 | 204 | 94 |

The comparative embodiment 3A and comparative embodiment 3B in Table 5 are obtained by adding 4-hydroxybenzoic acid and polyvinylamine to polyquaternium-6, and the comparative embodiment 3C is obtained by adding polyvinylamine to the polishing solution of comparative embodiment.

In Table 6, the polishing solution of the comparative embodiment 3A does not show the feature of auto stop on the surface of patterned chips. In other words, when the step height is high (for example, 15,071 Å in Table 6), the bump has high removal rates by polishing (for example, 4,206 Å/min in Table 6); but when the bump is being polished flat (the step height is as low as <200A, for example, 29 Å in Table 6), the bump and pit almost have the same high rates (for example, 6,800 Å/min and 6,708 Å/min, respectively). Likewise, the polishing solution of the comparative embodiment 3B does not show the feature of auto stop. In other words, when the step height is high (for example, 3,959 Å in Table 6), the bump has high removal rates by polishing (for example, 1,964 Å/min in Table 6); while when the bump is being polished flat (the step height is as low as <200A, for example, 37 Å in Table 6), the bump has low rates (for example, 0 in Table 6), but the pit has high polishing rates (for example, 0 in Table 6). While the embodiment 3C shows the real feature and function of auto stop: when the step height is high (for example, 19,793 Å in Table 6), the bump has high removal rates by polishing (for example, 5,388 Å/min in Table 6), and as the step height decreases (after planarization, for example, 109 Å in Table 6), the pit removal rates by polishing become lower (for example, 66 Å/min in Table 6). The auto stop is highly related to the step height. When the step height is as high as 10,000 Å, for example, and the polishing pad deforms and cannot have contact with the pit bottom, all polishing solutions can only start polishing from the step top; when the step height is reduced to 1,000 Å, for example, the polishing pad will suffer deformation, which becomes graver as the pressure increases. That is, the polishing pad will have contact with the pit bottom. At this moment, the bottom polishing rate will increase from 0. The lower is the step, the faster increases the bottom rate. The bottom rate increases till it is the same as that of the step top. The auto stop is that when the step is as low as less than 1,000 Å, for example, the bottom polishing rate remains as low as less than 300 Å/min, for example, like that of the blank. The auto stop is not the literally strict complete stop, but still has some polishing rates, for example, 300 Å/min. Certainly, these rates are subject to no strict numerical limits.

In conclusion, the chemical mechanical polishing solutions containing cerium oxide, polyquatemium-6 and 4-hydroxybenzoic acid, or those containing cerium oxide, polyquatemium-6 and polyvinylamine do not have the function of auto stop. However, the chemical mechanical polishing solutions obtained from cerium oxide with polyquatemium-6, 4-hydroxybenzoic acid and polyvinylamine have the function of auto stop.

As seen from the above comparative embodiments 1-2 and embodiment 3, only the chemical mechanical polishing solutions obtained from polyquaternium, carboxylic acid containing a benzene ring and polyvinylamine with cerium oxide can achieve the function of auto stop in its true sense.

Although the above specific embodiments of the present invention have been described in detail, they are only examples, and the present disclosure is limited to the embodiments described above. For those skilled in the art, any equivalent modification and substitution to the present invention is also covered in the present invention. Therefore, all these equivalent changes and modifications made without departing from the spirit and scope of the invention should be covered within the scope of the present invention.

The invention claimed is:

1. A chemical mechanical polishing solution, comprising cerium oxide, a polyquaternium, a carboxylic acid containing a benzene ring, polyvinylamine, and water;
    wherein the polyquaternium is one or more selected from the group consisting of polyquaternium-1, polyquaternium-2, polyquaternium-4, polyquaternium-6, polyquaternium-10, polyquaternium-11, polyquaternium-16, polyquaternium-37, polyquaternium-39, and polyquaternium-51;
    wherein the carboxylic acid containing the benzene ring is one or more selected from the group consisting of salicylic hydroxamic acid, salicylic acid and 4-hydroxybenzoic acid;
    wherein a concentration of the polyvinylamine is 0.5-6 ppm.

2. The chemical mechanical polishing solution according to claim 1, wherein the polyquaternium is polyquaternium-6.

3. The chemical mechanical polishing solution according to claim 1, wherein the carboxylic acid containing the benzene ring is 4-hydroxybenzoic acid.

4. The chemical mechanical polishing solution according to claim 1, wherein a concentration of the cerium oxide is 0.5 wt %-2 wt %.

5. The chemical mechanical polishing solution according to claim 4, wherein the concentration of the cerium oxide is 0.8-1.5 wt %.

6. The chemical mechanical polishing solution according to claim 1, wherein a concentration of the polyquaternium is 1-100 ppm.

7. The chemical mechanical polishing solution according to claim 6, wherein the concentration of the polyquaternium is 13.5 ppm-15 ppm.

8. The chemical mechanical polishing solution according to claim 1, wherein a concentration of the carboxylic acid containing the benzene ring is 900-2,500 ppm.

9. The chemical mechanical polishing solution according to claim 8, wherein the concentration of the carboxylic acid containing the benzene ring is 1,000-2,000 ppm.

10. The chemical mechanical polishing solution according to claim 1, wherein the concentration of the polyvinylamine is 1-4 ppm.

11. The chemical mechanical polishing solution according to claim 1, wherein a molecular weight of the polyvinylamine is from 400 to 750,000.

12. The chemical mechanical polishing solution according to claim 11, wherein the molecular weight of the polyvinylamine is from 600-25,000.

\* \* \* \* \*